(12) United States Patent
Tanabe et al.

(10) Patent No.: US 11,199,593 B2
(45) Date of Patent: Dec. 14, 2021

(54) MAGNETIC SENSOR

(71) Applicant: TDK Corporation, Tokyo (JP)

(72) Inventors: Kei Tanabe, Tokyo (JP); Akihiro Unno, Tokyo (JP)

(73) Assignee: TDK Corporation, Tokyo (JP)

( * ) Notice: Subject to any disclaimer, the term of this patent is extended or adjusted under 35 U.S.C. 154(b) by 61 days.

(21) Appl. No.: 16/603,636

(22) PCT Filed: Apr. 6, 2018

(86) PCT No.: PCT/JP2018/014707
§ 371 (c)(1),
(2) Date: Oct. 8, 2019

(87) PCT Pub. No.: WO2018/190261
PCT Pub. Date: Oct. 18, 2018

(65) Prior Publication Data
US 2020/0355758 A1 Nov. 12, 2020

(30) Foreign Application Priority Data
Apr. 12, 2017 (JP) .............................. JP2017-079300

(51) Int. Cl.
*G01R 33/09* (2006.01)
*G01R 33/00* (2006.01)

(52) U.S. Cl.
CPC ......... *G01R 33/09* (2013.01); *G01R 33/0017* (2013.01)

(58) Field of Classification Search
CPC ............................ G01R 33/0017; G01R 33/09
See application file for complete search history.

(56) References Cited

U.S. PATENT DOCUMENTS

| 2015/0331072 A1* | 11/2015 | Ogawa | G01R 33/1253 |
| | | | 324/252 |
| 2018/0321332 A1 | 11/2018 | Tanabe | |
| 2018/0335483 A1 | 11/2018 | Takaki et al. | |

FOREIGN PATENT DOCUMENTS

| JP | 2003-344515 A | 12/2003 |
| JP | 2005-188947 A | 7/2005 |

(Continued)

OTHER PUBLICATIONS

International Search Report of International Application No. PCT/JP2018/014707, dated Jun. 26, 2018.

*Primary Examiner* — Noam Reisner
(74) *Attorney, Agent, or Firm* — Leydig, Voit & Mayer Ltd.; John Augustyn

(57) ABSTRACT

A magnetic sensor suppressing bias magnetic field effects includes a magnetic detecting unit including first to fourth magneto-resistive elements to which a first magnetic field to be detected is applied, a differential amplifier into which the output voltage of the magnetic detecting unit is input, a first magnetic field generating conductor which, by a first feedback current output by the differential amplifier, applies to the magnetic detecting unit a second magnetic field to cancel the first magnetic field detected by the magnetic detecting unit, a bias magnetic field detector which detects a bias magnetic field applied to the magnetic detecting unit and outputs a second feedback current corresponding to the bias magnetic field, and a second magnetic field generating conductor which, by the second negative feedback current, applies to the magnetic detecting unit a correcting magnetic field to cancel the bias magnetic field detected by the magnetic detecting unit.

13 Claims, 6 Drawing Sheets

(56) References Cited

FOREIGN PATENT DOCUMENTS

| | | | |
|---|---|---|---|
| JP | 2005188947 A | * | 7/2005 |
| JP | 2006184116 A | | 7/2006 |
| WO | WO 2016/080470 A1 | | 5/2016 |
| WO | WO 2017/077870 A1 | | 5/2017 |

* cited by examiner

Comparative Example

MAGNETIC SENSOR

TECHNICAL FIELD

The present invention relates to a magnetic sensor which is constituted to supply a negative feedback current corresponding to a detection target magnetic field applied to a magnetic detecting unit into a magnetic field generating conductor.

BACKGROUND ART

A patent document 1 below discloses a magnetic field detection sensor capable of detecting a fine magnetic field. This magnetic field detection sensor includes four magneto-resistive elements constituting a bridge circuit and a magnetic body. The fixed magnetization directions of the four magneto-resistive sensors are the same. The magnetic body collects a detection target magnetic field whose direction is vertical to the bridge circuit and changes the direction of the collected detection target magnetic field to a direction substantially parallel to the fixed magnetization directions of the four magneto-resistive elements constituting the bridge circuit. Differential output from the bridge circuit is input into a differential operational circuit. The differential operational circuit supplies a feedback current into a magnetic field generating conductor. The magnetic field generating conductor in which the feedback current flows generates a magnetic field having a direction opposite to the direction of the detection target magnetic field against the four magneto-resistive elements. By measuring the feedback current, the detection target magnetic field is measured.

PRIOR ART DOCUMENT

Patent Document

[Patent Document 1] Japanese Laid-Open Patent Publication No. 2015-219061

SUMMARY OF THE INVENTION

Problem to be Solved by the Invention

In the magnetic sensor of the patent document 1, even when a bias magnetic field (magnetic field not to be detected such as a disturbance magnetic field) having the same direction or the same phase is applied to the four magneto-resistive elements, the resistance changes of the four magneto-resistive elements are the same. Therefore, the bridge circuit does not detect the bias magnetic field. However, the bias magnetic field changes an operating point of the magneto-resistive elements, thereby affecting the output of the magnetic sensor. That is, when the magnetic field intensity in the fixed layer magnetization direction of the magneto-resistive element becomes higher than a certain value, sensitivity, that is, a resistance value change with respect to a magnetic field change decreases. Therefore, when the bias magnetic field becomes large, the sensitivity of the magnetic sensor lowers, whereby assumed output is not obtained for a detection target magnetic field (refer to FIG. 12).

It is an object of the present invention which was made in this situation to provide a magnetic sensor capable of suppressing effects of a bias magnetic field.

Means for Solving Problem

One embodiment of the present invention relates to a magnetic sensor. The magnetic sensor includes:

a magnetic detecting unit including first and second magnetic detecting elements to which a first magnetic field to be detected is applied;

a first differential amplifier into which an output voltage of the magnetic detecting unit is input;

a first magnetic field generating conductor which, by means of the flow of a first negative feedback current output by the first differential amplifier, applies a second magnetic field to the first and second magnetic detecting elements to cancel out the first magnetic field detected by the first and second magnetic detecting elements;

a bias magnetic field detecting means which detects a predetermined direction component of a bias magnetic field applied to the first and second magnetic detecting elements and outputs a second negative feedback current corresponding to the size of the predetermined direction component; and a second magnetic field generating conductor which, by means of the flow of the second negative feedback current, applies a correcting magnetic field to the first and second magnetic detecting elements, wherein total of the predetermined direction component of the bias magnetic field and the predetermined direction component of the correcting magnetic field at positions of the first and second magnetic detecting elements is substantially constant.

The total of the predetermined direction component of the bias magnetic field and the predetermined direction component of the correcting magnetic field at the positions of the first and second magnetic detecting elements may be substantially zero.

Another embodiment of the present invention relates to a magnetic sensor. The magnetic sensor includes:

a magnetic detecting unit including first and second magnetic detecting elements to which a first magnetic field to be detected is applied;

a first differential amplifier into which an output voltage of the magnetic detecting unit is input;

a first magnetic field generating conductor which, by means of the flow of a first negative feedback current output by the first differential amplifier, applies to the first and second magnetic detecting elements a second magnetic field to cancel out the first magnetic field detected by the first and second magnetic detecting elements;

a bias magnetic field detecting means which detects a predetermined direction component of a bias magnetic field applied to the first and second magnetic detecting elements and outputs a second negative feedback current corresponding to the size of the predetermined direction component; and a second magnetic field generating conductor which, by means of the flow of the second negative feedback current, applies a correcting magnetic field to the first and second magnetic detecting elements to cancel out the bias magnetic field at the positions of the first and second magnetic detecting elements.

The magnetic sensor may include a magnetic body which changes direction of the first magnetic field to be detected so that the first magnetic field has magnetic field components opposite to each other at the positions of the first and second magnetic detecting elements.

The first and second magnetic detecting elements may be magneto-resistive elements. The bias magnetic field detecting means may detect the bias magnetic field by a current flowing through the first and second magnetic detecting elements.

The first and second magnetic detecting elements may have the same fixed layer magnetization direction.

The bias magnetic field detecting means may output the second negative feedback current so that a current flowing through the first and second magnetic detecting elements becomes a reference value.

The bias magnetic field detecting means may have a magnetic detecting element to which the bias magnetic field is applied and a second differential amplifier which outputs the second negative feedback current upon the input of the output voltage of the magnetic detecting element.

It is to be noted that any arbitrary combination of the above-described structural components as well as the expressions according to the present invention changed among a system and so forth are all effective as and encompassed by the present aspects.

Effect of the Invention

According to the present invention, a magnetic sensor capable of suppressing effects of a bias magnetic field can be provided.

EMBODIMENT FOR CARRYING OUT THE INVENTION

Figure 1:
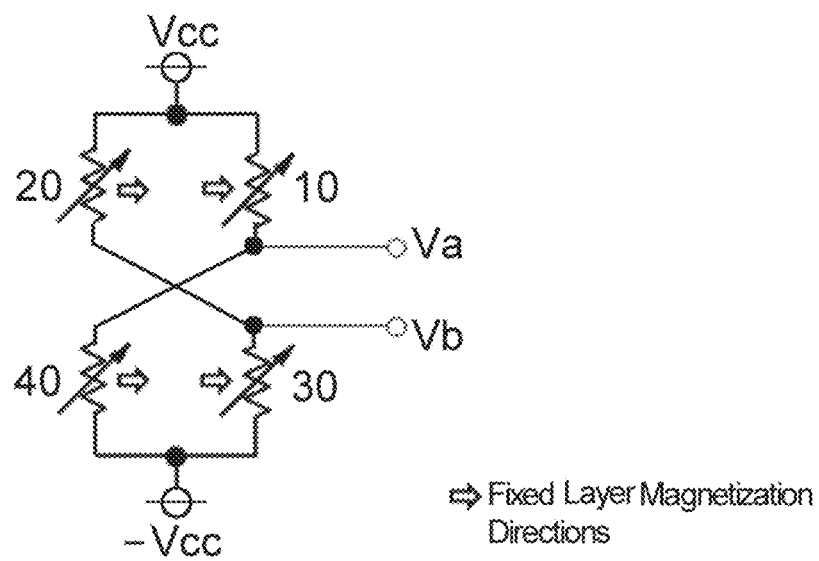
FIG. 1 is a schematic circuit diagram of a bridge circuit constituting the magnetic detecting unit of a magnetic sensor according to a first embodiment of the present invention.

Preferred embodiments of the present invention will now be described in detail with reference to the drawings. The same or equivalent constituent parts, members, etc., shown in the drawings are designated by the same reference numerals and will not be repeatedly described as appropriate. The embodiments are not intended to limit the invention but are mere exemplifications, and all features or combinations thereof described in the embodiments do not necessarily represent the intrinsic natures of the invention.

First Embodiment

Figure 9:
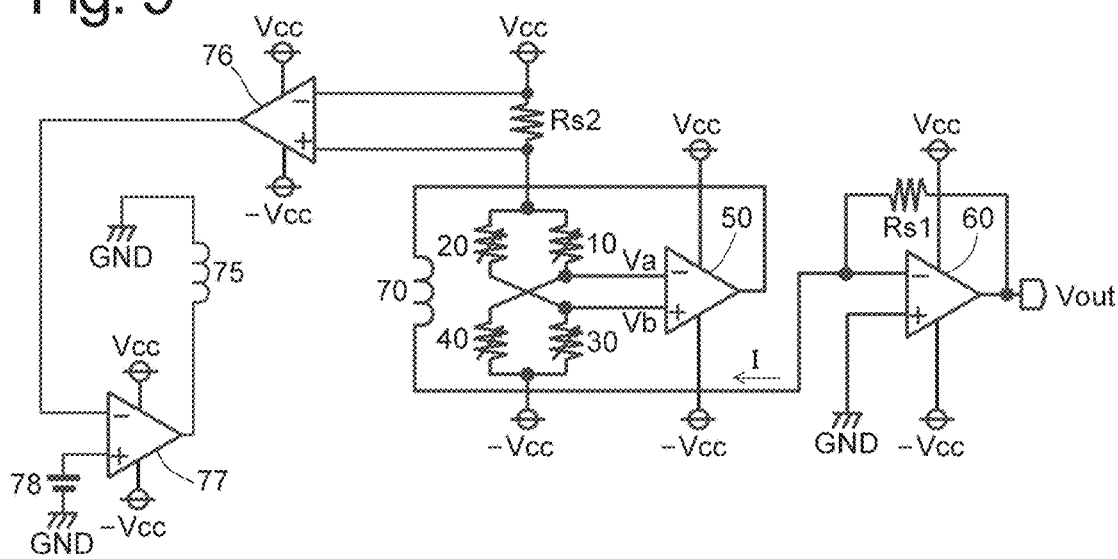
FIG. 9 is a schematic circuit diagram of the magnetic sensor of the first embodiment.

FIG. 1 is a schematic circuit diagram of a bridge circuit constituting the magnetic detecting unit of a magnetic sensor according to a first embodiment of the present invention. This bridge circuit includes a first magneto-resistive element 10, a second magneto-resistive element 20, a third magneto-resistive element 30 and a fourth magneto-resistive element 40. Fixed layer magnetization directions of the first to fourth magneto-resistive elements (10, 20, 30, 40) are the same (+X direction). A direction parallel to the fixed layer magnetization direction is a sensing direction of each of the magneto-resistive elements. One end of the first magneto-resistive element 10 and one end of the second magneto-resistive element 20 are connected to a first power line to which a first power voltage Vcc is supplied. Though not shown in FIG. 1, when a bias magnetic field is detected by a current flowing from the first to fourth magneto-resistive elements (10, 20, 30, 40), as shown in FIG. 9, a current detection resistor (second detection resistor Rs2 in FIG. 9) is provided between the first power line and one ends of the first magneto-resistive element 10 and the second magneto-resistive element 20. The other end of the first magneto-resistive element 10 is connected to one end of the fourth magneto-resistive element 40. The other end of the second magneto-resistive element 20 is connected to one end of the third magneto-resistive element 30. The other end of the third magneto-resistive element 30 and the other end of the fourth magneto-resistive element 40 are connected to a second power line to which a second power voltage −Vcc is supplied. A voltage output to an interconnection point between the first magneto-resistive element 10 and the fourth magneto-resistive element 40 is represented by Va, and a voltage output to an interconnection point between the second magneto-resistive element 20 and the third magneto-resistive element 30 is represented by Vb.

Figure 2:
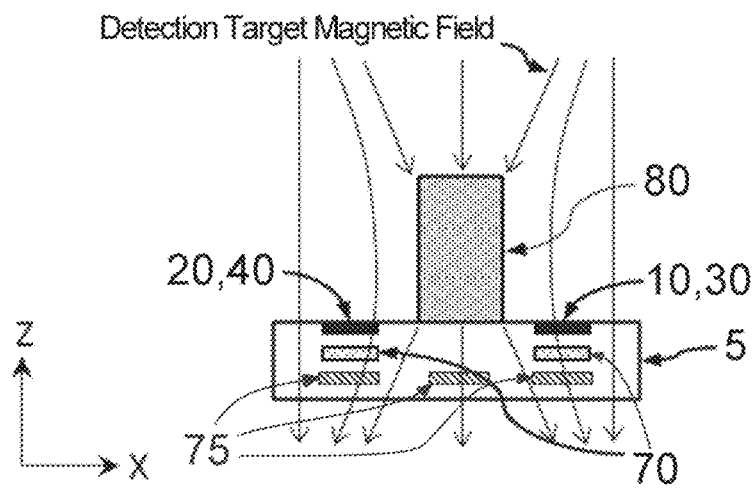
FIG. 2 is a schematic sectional view of the magnetic detecting unit and therearound in the magnetic sensor.
Figure 3:
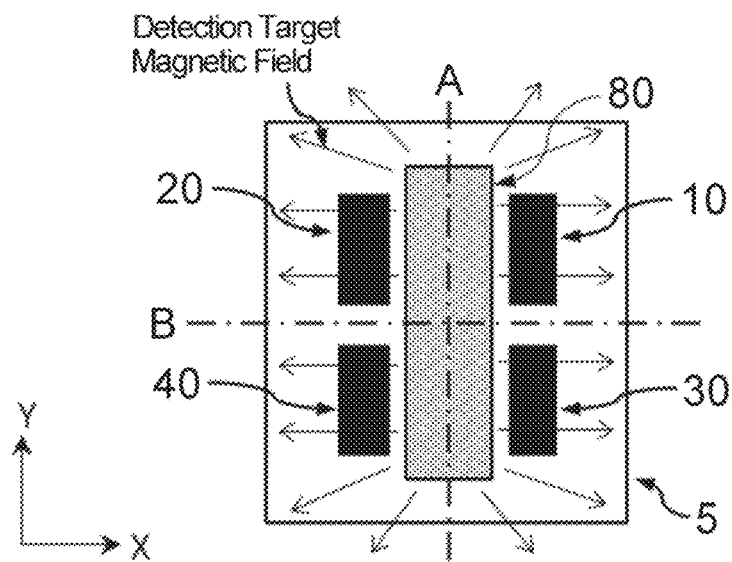
FIG. 3 is a schematic top view of the magnetic detecting unit and therearound in the magnetic sensor.

FIG. 2 is a schematic sectional view of the magnetic detecting unit and therearound in the magnetic sensor of this embodiment. FIG. 3 is a schematic top view of the magnetic detecting unit. X, Y and Z axes which are orthogonal to one another are defined by FIG. 2 and FIG. 3. In FIG. 2 and FIG. 3, the magnetic force lines of a detection target magnetic field are shown. In the magnetic sensor of this embodiment, the first to fourth magneto-resistive elements (10, 20, 30, 40) are formed in a laminate 5 together with a first magnetic field generating conductor 70 and a second magnetic field generating conductor 75. A magnetic body 80 is formed on the surface of the laminate 5. As shown in FIG. 3, the first magneto-resistive element 10 and the third magneto-resistive element 30 are at the same position in the X direction. Similarly, the second magneto-resistive element 20 and the fourth magneto-resistive element 40 are at the same position in the X direction. The first magneto-resistive element 10 and the second magneto-resistive element 20 are at the same position in the Y direction. Similarly, the third magneto-resistive element 30 and the fourth magneto-resistive element 40 are at the same position in the Y direction.

In FIG. 3, a center line with respect to which the first magneto-resistive element 10 and the third magneto-resistive element 30 are arranged linearly symmetric to the second magneto-resistive element 20 and the fourth magneto-resistive element 40 is represented by A. Also, a center line with respect to which the first magneto-resistive element 10 and the second magneto-resistive element 20 are arranged linearly symmetric to the third magneto-resistive element 30 and the fourth magneto-resistive element 40 is represented by B. The magnetic body 80 is preferably located at a position where the center line thereof in the X direction and the center line thereof in the Y direction coincide with A and B, respectively. Preferably, the magnetic body 80 extends on the Y direction side of the first magneto-resistive element 10 and the second magneto-resistive element 20 and on the −Y direction side of the third magneto-resistive element 30 and the fourth magneto-resistive element 40. Further, the magnetic body 80 is preferably at a position where the end face on the laminate 5 side is the closest to the first to fourth magneto-resistive elements (10, 20, 30, 40) in the Z direction. In other words, the end face on the laminate 5 side is preferably in contact with the surface of the laminate 5. By arranging the magnetic body 80 like this, resistances changes of the first to fourth magneto-resistive elements (10, 20, 30, 40) corresponding to changes in the detection target magnetic field occur efficiently and uniformly.

A layer forming the first magnetic field generating conductor 70 in the laminate 5 is preferably a lower layer (−Z direction side layer) than a layer forming the first to fourth magneto-resistive elements (10, 20, 30, 40). By arranging the first magnetic field generating conductor 70 below the layer forming the first to fourth magneto-resistive elements (10, 20, 30, 40), the magnetic body 80 can be made close to the first to fourth magneto-resistive elements (10, 20, 30, 40) in the Z direction, thereby making it possible for the first to fourth magneto-resistive elements (10, 20, 30, 40) to respond to changes in the detection target magnetic field efficiently. A layer forming the second magnetic field generating conductor 75 in the laminate 5 is existent below the layer forming the first magnetic field generating conductor 70 in the example shown in FIG. 2 but may be existent above the layer forming the first magnetic field generating conductor 70. The magnetic body 80 may be a soft magnetic body. The magnetic body 80 collects a detection target magnetic field whose direction is parallel to the Z direction and changes the direction of the collected detection target magnetic field to a direction substantially parallel to the fixed layer magnetization direction (X direction) of the first to fourth magneto-resistive elements (10, 20, 30, 40). The X component of the detection target magnetic field at the positions of the first magneto-resistive element 10 and the third magneto-resistive element 30, and the X component of the detection target magnetic field at the positions of the second magneto-resistive element 20 and the fourth magneto-resistive element 40, are made opposite to each other in direction by the magnetic body 80, and become differential magnetic fields which differ in phase by 180° (antiphase) in the case of AC.

Figure 4:
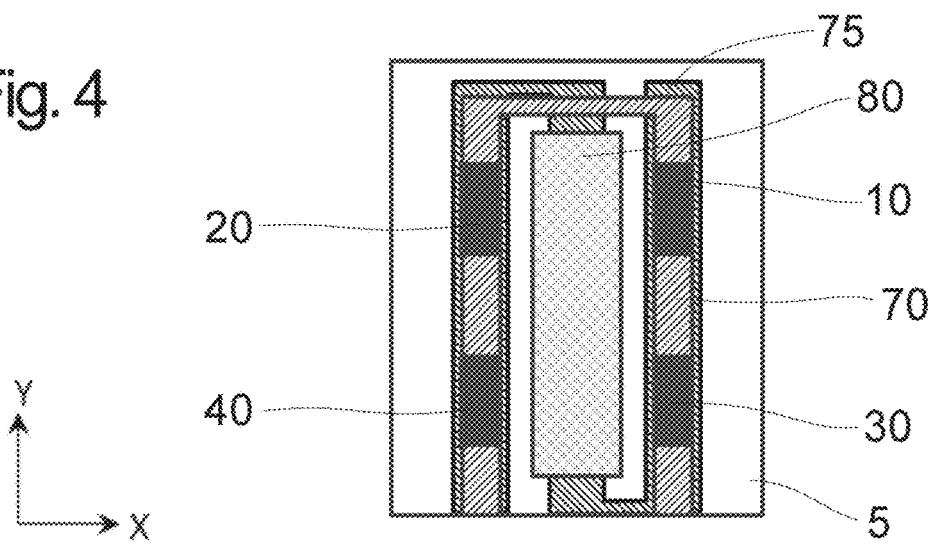
FIG. 4 is a diagram for explaining wiring patterns of a first magnetic field generating conductor 70 and a second magnetic field generating conductor 75 in the magnetic sensor.
Figure 5:
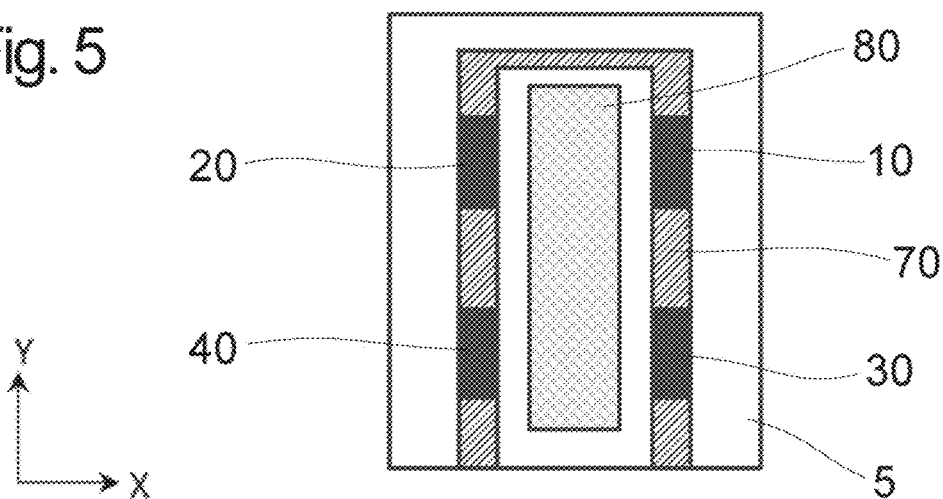
FIG. 5 is a diagram for explaining the wiring pattern of the first magnetic field generating conductor 70 in the magnetic sensor, in which the second magnetic field generating conductor 75 is omitted from FIG. 4.
Figure 6:
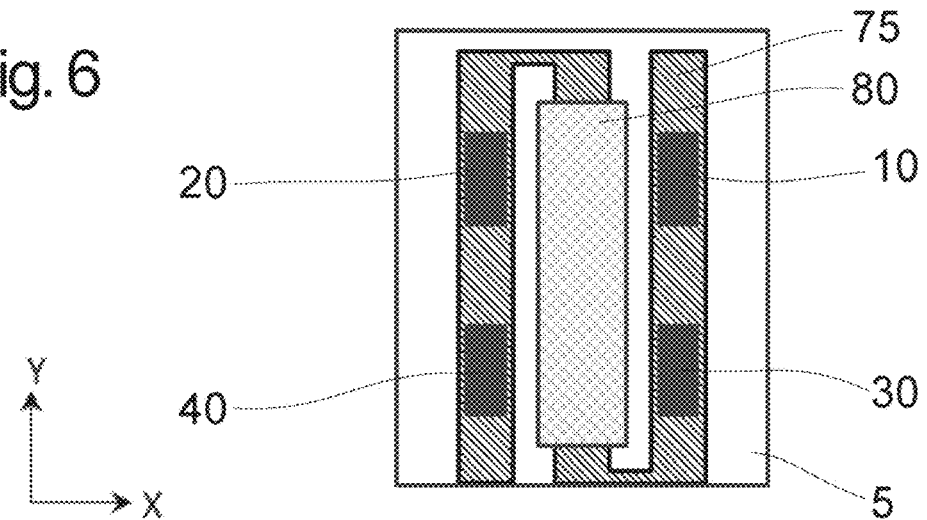
FIG. 6 is a diagram for explaining the wiring pattern of the second magnetic field generating conductor 75 in the magnetic sensor, in which the first magnetic field generating conductor 70 is omitted from FIG. 4.

FIG. 4 is a diagram for explaining wiring patterns of the first magnetic field generating conductor 70 and the second magnetic field generating conductor 75 in the magnetic sensor of this embodiment. FIG. 5 is a diagram for explaining the wiring pattern of the first magnetic field generating conductor 70 in the above magnetic sensor, in which the second magnetic field generating conductor 75 is omitted from FIG. 4. FIG. 6 is a diagram for explaining the wiring pattern of the second magnetic field generating conductor 75 in the above magnetic sensor, in which the first magnetic field generating conductor 70 is omitted from FIG. 4. In FIG. 4 and FIG. 5, the wiring pattern of the first magnetic field generating conductor 70 in the laminate 5 is shown by solid lines. Similarly, in FIG. 4 and FIG. 6, the wiring pattern of the second magnetic field generating conductor 75 in the laminate 5 is shown by solid lines.

The first magnetic field generating conductor 70 is formed in preferably a single layer in the same laminate 5 as the first to fourth magneto-resistive elements (10, 20, 30, 40). In the example shown in FIG. 4 and FIG. 5, the first magnetic field generating conductor 70 is a U-shaped planar coil of less than one turn but may be a planar coil which spirally circulates more than one turns. The first magnetic field generating conductor 70 generates a second magnetic field as will be described in FIG. 9 hereinafter. The second magnetic field cancels out a detection target magnetic field (first magnetic field) detected by each magneto-resistive element, that is, has a magnetic field component which cancels out the sensing direction component of the detection target magnetic field. Though the word "cancel out" is preferably to make magnetic field zero, "cancel out" may be to cancel only part of the first magnetic field. The same can be said of a correcting magnetic field (anti-bias magnetic field) generated by the second magnetic field generating conductor 75 which will be described hereinafter.

The second magnetic field generating conductor 75 is formed in preferably a single layer in the same laminate 5 as the first to fourth magneto-resistive elements (10, 20, 30, 40). In the example shown in FIG. 4 and FIG. 6, the second magnetic field generating conductor 75 has a meandering conductor pattern. Stated more specifically, the second magnetic field generating conductor 75 extends in the +Y direction from one end thereof, while the one end is located at the same position in the X direction as the fourth magneto-resistive element 40 and on the −Y direction side of the fourth magneto-resistive element 40, to reach the +Y direction side of the second magneto-resistive element 20, extends in the +X direction from there to reach the same position in the X direction as the magnetic body 80, extends in the −Y direction from there to reach the −Y direction side of the magnetic body 80, extends in the +X direction from there to reach the same position in the X direction as the third magneto-resistive element 30, and extends in the +Y direction from there to reach the +Y direction side of the first magneto-resistive element 10 (the other end located at the same position in the X direction as the first magneto-resistive element 10 and on the +Y direction side of the first magneto-resistive element 10). The second magnetic field generating conductor 75 generates a correcting magnetic field having a magnetic field component to cancel out the X direction component (sensing direction component) of a bias magnetic field at the position of each magneto-resistive element as will be described in FIG. 9. In this embodiment, the bias magnetic field is a uniform magnetic field in an arbitrary direction when the magnetic body 80 is not existent, and the X direction component of the bias magnetic field is cancelled out by the correcting magnetic field.

Figure 7:
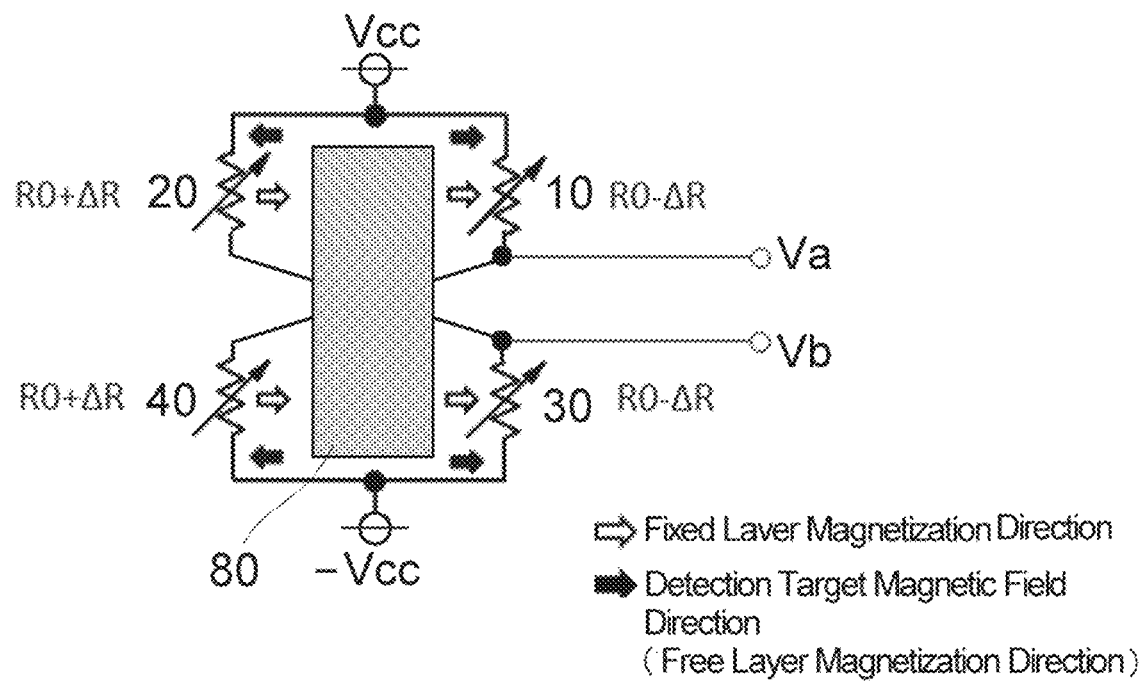
FIG. 7 is a schematic diagram showing the direction of a detection target magnetic field at the position of each of the magneto-resistive elements of the bridge circuit shown in FIG. 1 and a resistance value change of each magneto-resistive element by the detection target magnetic field.

FIG. 7 is a schematic diagram showing the direction of a detection target magnetic field at the position of each magneto-resistive element of the bridge circuit shown in FIG. 1 and a resistance value change of each magneto-resistive element caused thereby. In FIG. 7, the detection target magnetic field is a magnetic field parallel to the −Z direction as a whole when the magnetic body 80 is not existent but partially curbed by the magnetic body 80 and has a component in the direction shown in FIG. 7 at the position of each of the first to fourth magneto-resistive elements (10, 20, 30, 40).

Figure 8:
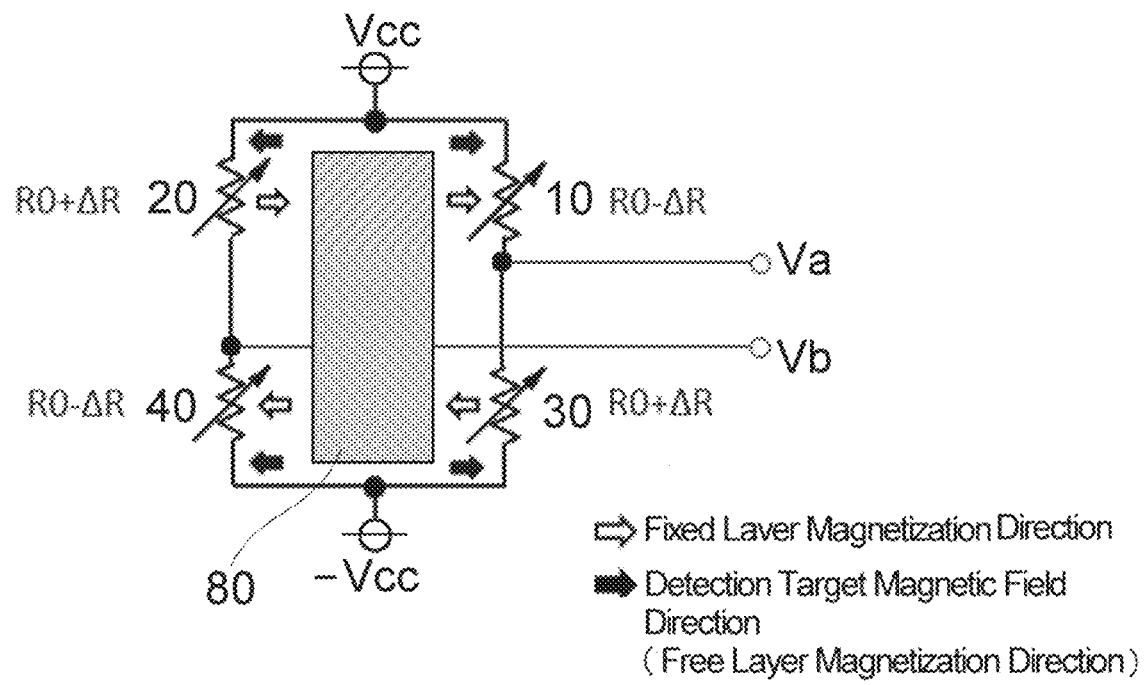
FIG. 8 is a schematic diagram showing a variation of FIG. 7.

Since the detection target magnetic field has a component having the same direction as the fixed layer magnetization direction in the first magneto-resistive element 10, the free layer magnetization direction coincides with the fixed layer magnetization direction, and the resistance value of the first magneto-resistive element 10 changes from R0 at the time of no magnetic field by −ΔR. Meanwhile, since the detection target magnetic field has a component having a direction opposite to the fixed layer magnetization direction in the second magneto-resistive element 20, the free layer magnetization direction becomes opposite to the fixed layer magnetization direction, and the resistance value of the second magneto-resistive element 20 changes from R0 at the time of no magnetic field by +ΔR. Similarly, the resistance value of the third magneto-resistive element 30 changes from R0 at the time of no magnetic field by −ΔR, and the resistance value of the fourth magneto-resistive element 40 changes from R0 at the time of no magnetic field by +ΔR. Due to these resistance values changes of the first to fourth magneto-resistive elements (10, 20, 30, 40), the voltage Va becomes higher than at the time of no magnetic field and the voltage Vb becomes lower than at the time of no magnetic field. Therefore, the bridge circuit including the first to fourth magneto-resistive elements (10, 20, 30, 40) can perform differential output, that is, can output voltage Va and voltage Vb which change reversely according to a change in the detection target magnetic field. Even when the wiring of the bridge circuit is changed and the fixed layer magnetization directions of the third magneto-resistive element 30 and the fourth magneto-resistive element 40 are changed as shown in FIG. 8, differential output is possible as well.

FIG. 9 is a schematic circuit diagram of the magnetic sensor of this embodiment. The first to fourth magneto-resistive elements (10, 20, 30, 40) which are bridge connected constitute a magnetic detecting unit to which a first magnetic field to be detected is applied. An inverted input terminal of a first operational amplifier 50 as a first differential amplifier is connected to an interconnection part between the first magneto-resistive element 10 and the fourth magneto-resistive element 40. A non-inverted input terminal thereof is connected to an interconnection part between the second magneto-resistive element 20 and the third magneto-resistive element 30. An output terminal thereof is connected to one end of the first magnetic field generating conductor 70. The output voltages (Va, Vb) of the magnetic detecting unit are input into the first operational amplifier 50. The first operational amplifier 50 supplies a negative feedback current to the first magnetic field generating conductor 70.

The first magnetic field generating conductor 70 generates a second magnetic field when the negative feedback current output by the first operational amplifier 50 flows therethrough. The second magnetic field cancels out the first magnetic field (detection target magnetic field) detected by each magneto-resistive element. In other words, the first operational amplifier 50 supplies a negative feedback current to the first magnetic field generating conductor 70 so that the first magnetic field generating conductor 70 generates the second magnetic field having a magnetic field component to cancel out the sensing direction component of the first magnetic field at the position of each magneto-resistive element, that is, a magnetic balance state is established between the first and second magnetic fields at the position of each magneto-resistive element. Since the first magnetic field generating conductor 70 forms a current path shown in FIG. 4 and FIG. 5, the second magnetic field at the positions of the first magneto-resistive element 10 and the third magneto-resistive element 30 and the second magnetic field at the positions of the second magneto-resistive element 20 and the fourth magneto-resistive element 40 become parallel to the X direction and opposite to each other in direction. A first detection resistor Rs1 is provided in the path of the negative feedback current (connected in series to the first magnetic field generating conductor 70).

The inverted input terminal of a second operational amplifier 60 which is an example of differential amplifier is connected to one end, on the first magnetic field generating conductor 70 side, of the first detection resistor Rs1. The output terminal thereof is connected to the other end of the first detection resistor Rs1. The non-inverted input terminal thereof is connected to the ground as a constant voltage terminal. The first operational amplifier 50 and the second operational amplifier 60 are driven by dual powder sources and connected to a first power line to which first power voltage Vcc is supplied and to a second power line to which second power voltage −Vcc is supplied. The voltage of the output terminal of the second operational amplifier 60 becomes the output voltage Vout of the magnetic sensor. When the negative feedback current is represented by I as shown in FIG. 9, the output voltage Vout is represented by Vout=Rs1×I. Since the negative feedback current is in proportion to the magnitude of the detection target magnetic field (first magnetic field), the output voltage Vout is also in proportion to the detection target magnetic field, whereby the detection target magnetic field can be detected by the output voltage Vout.

A description is subsequently given of a bias magnetic field detecting means in this embodiment. The bias magnetic field detecting means includes a second detection resistor Rs2, a third operational amplifier 76, a fourth operational amplifier 77 and a reference voltage source 78. The second detection resistor Rs2 is provided between the first power line to which the first power voltage Vcc is supplied and one ends of the first magneto-resistive element 10 and the second magneto-resistive element 20. The second detection resistor Rs2 converts a current flowing through the bridge circuit including the first to fourth magneto-resistive elements (10, 2, 30, 40) into voltage. The current flowing through the bridge circuit is in inverse proportion to the combined resistance of the bridge circuit. The combined resistance of the bridge circuit is changed by the X direction component of a bias magnetic field. Therefore, when voltages between both ends of the second detection resistor Rs2 are specified, the X direction component of the bias magnetic field is specified. The second detection resistor Rs2 may be provided between the second power line to which the second power voltage −Vcc is supplied and the other ends of the third magneto-resistive element 30 and the fourth magneto-resistive element 40.

The inverted input terminal and non-inverted input terminal of the third operational amplifier 76 which is an example of differential amplifier are connected to both ends of the second detection resistor Rs2, respectively. The output terminal of the third operational amplifier 76 is connected to the inverted input terminal of the fourth operational amplifier 77 as a second differential amplifier. The reference voltage source 78 is connected between the non-inverted input terminal of the fourth operational amplifier 77 and the ground. The second magnetic field generating conductor 75 is connected between the output terminal of the fourth operational amplifier 77 and the ground. The third operational amplifier 76 outputs a voltage in proportion to the voltage between both ends of the second detection resistor Rs2, that is, a voltage in proportion to a current flowing through the bridge circuit including the first to fourth magneto-resistive elements (10, 20, 30, 40). The fourth operational amplifier 77 supplies a negative feedback current to the second magnetic field generating conductor 75 so that the difference between the output voltage of the third operational amplifier 76 and the output voltage of the reference voltage source 78 becomes substantially zero. The output voltage of the reference voltage source 78 is preferably equal to the output voltage of the third operational amplifier 76 when there is no bias magnetic field, which is corresponding to a current flowing through the bridge circuit when there is no bias magnetic field. Thereby, the total of the X direction component of the bias magnetic field and the X direction component of the correcting magnetic field at the position of each magneto-resistive element becomes substantially constant at zero. In other words, the current flowing through the bridge circuit becomes substantially equal to a current flowing therethrough when there is no bias magnetic field. The third operational amplifier 76 and the fourth operational amplifier 77 are driven by dual power sources and connected to the first power line to which first power voltage Vcc is supplied and to the second power line to which second power voltage −Vcc is supplied.

The second magnetic field generating conductor 75 generates a correcting magnetic field when the negative feedback current output by the fourth operational amplifier 77 flows therethrough. The correcting magnetic field cancels out a bias magnetic field at the position of each magneto-resistive element. In other words, the fourth operational amplifier 77 supplies a negative feedback current to the second magnetic field generating conductor 75 so that the second magnetic field generating conductor 75 generates a correcting magnetic field having a magnetic field component to cancel out the sensing direction component of the bias magnetic field at the position of each magneto-resistive element, that is, a magnetic balance state is established between the bias magnetic field and the correcting magnetic field at the position of each magneto-resistive element. Since the second magnetic field generating conductor 75 forms a current path shown in FIG. 4 and FIG. 6, the correcting magnetic fields at the positions of the first to fourth magneto-resistive elements (10, 20, 30, 40) are parallel to the X direction and have the same direction.

Figure 10:
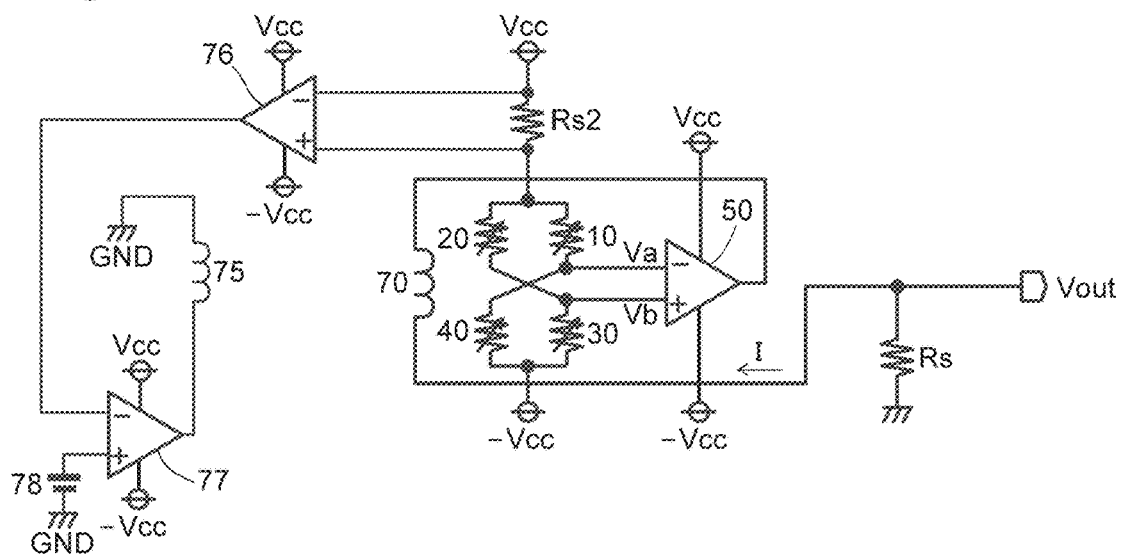
FIG. 10 is a schematic circuit diagram showing a variation of FIG. 9.

FIG. 10 is a schematic circuit diagram showing a variation of FIG. 9. The circuit shown in FIG. 10 is the same as the circuit shown in FIG. 9 except that there is no second operational amplifier 60, the other end of the first detection resistor Rs1 is connected to the ground and a voltage at one end of the first detection resistor Rs1 is output voltage Vout. The output voltage Vout in FIG. 10 is the same calculated value as the output voltage Vout in FIG. 9 except that the plus/minus is inverted, but differs from the output voltage in FIG. 9 in frequency characteristics as will be described in FIG. 13 and FIG. 14 hereinafter.

Figure 11:
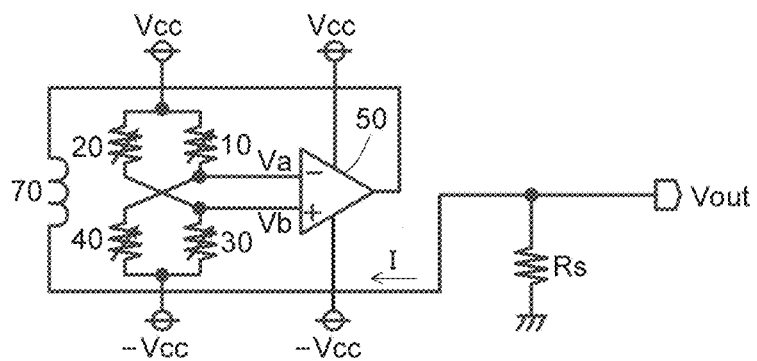
FIG. 11 is a schematic circuit diagram of a magnetic sensor according to a comparative example.

FIG. 11 is a schematic circuit diagram of a magnetic sensor according to a comparative example. The circuit shown in FIG. 11 is the same as the circuit shown in FIG. 10 except that there are no bias magnetic field detecting means (second detection resistor Rs2, third operational amplifier 76, fourth operational amplifier 77 and reference voltage source 78) and no second magnetic field generating conductor 75. In an environment where there is no bias magnetic field, the output voltage Vout in FIG. 11 is equal to the output voltage Vout in FIG. 10. However, in an environment where there is a bias magnetic field, the output voltage Vout in FIG. 11 may not become an estimated value for a change in the detection target magnetic field due to sensitivities reduction of the first to fourth magneto-resistive elements (10, 20, 30, 40).

Figure 12:
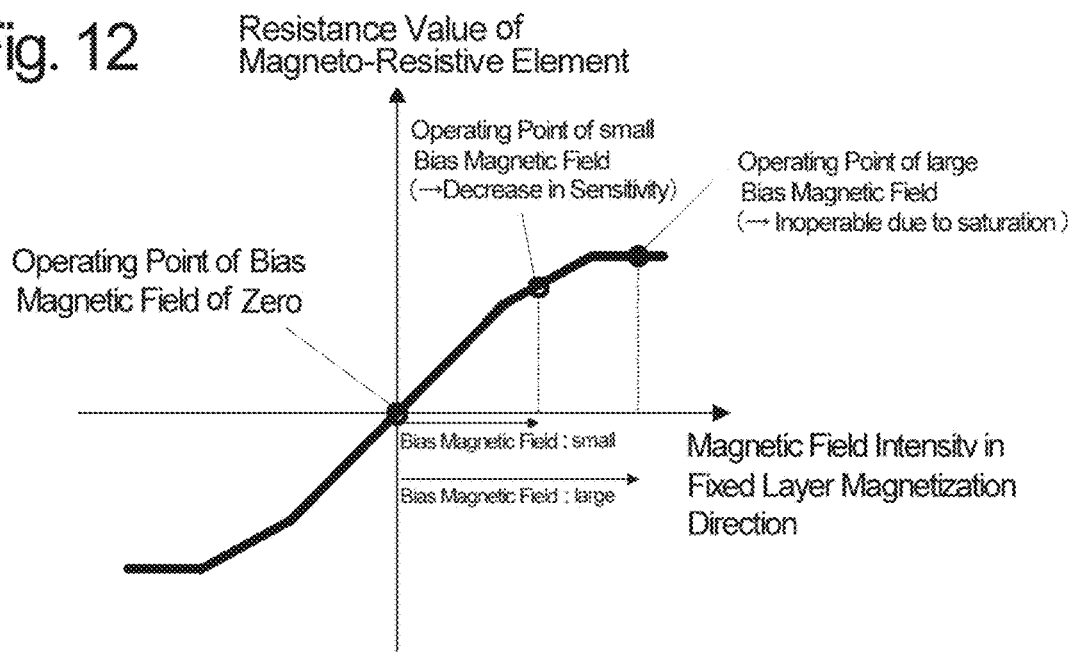
FIG. 12 is a characteristic diagram showing an example of a resistance value change of a magneto-resistive element with respect to the magnetic field intensity in the fixed layer magnetization direction.

FIG. 12 is a characteristic diagram showing an example of a resistance value change with respect to the magnetic field intensity in the fixed layer magnetization direction of a magneto-resistive element. As shown in FIG. 12, when the magnetic field intensity in the fixed layer magnetization direction of the magneto-resistive element is within a certain value, the magnetic field intensity and the resistance value have a linear relationship. However, when the magnetic field intensity becomes higher than a certain value, the change (inclination) of the resistance value with respect to a change in magnetic field intensity becomes small. When the magnetic field intensity becomes much higher, the resistance value does not change any more with respect to the magnetic field intensity. Therefore, the magneto-resistive element has high sensitivity and can take the maximum linear change in resistance value (can take the largest amplitude of the output voltage in the linear region) at an operating point where the bias magnetic field is zero shown in FIG. 12. Meanwhile, the magneto-resistive element deteriorates in sensitivity and cannot take a large linear change in resistance value at an operating point where the bias magnetic field is small shown in FIG. 12 as compared with an operating point where the bias magnetic field is zero. At an operating point where the bias magnetic field is large shown in FIG. 12, the magneto-resistive element cannot operate due to saturation.

In the circuits shown in FIG. 9 and FIG. 10, the second magnetic field generating conductor 75 generates a correcting magnetic field by a negative feedback current supplied by the fourth operational amplifier 77, whereby the operating points of the first to fourth magneto-resistive elements (10, 20, 30, 40) can be stabilized at operating points where the bias magnetic field is zero or points close to the above points even under an environment where the bias magnetic field is large. In contrast to this, in the circuit of the comparative example shown in FIG. 11, as the operating points of the first to fourth magneto-resistive elements (10, 20, 30, 40) change arbitrarily according to the magnitude of the bias magnetic field, sensitivity becomes unstable due to the unstable operating points. And when the bias magnetic field is large, there are risks such as lowered sensitivity and impossible detection.

Figure 13:
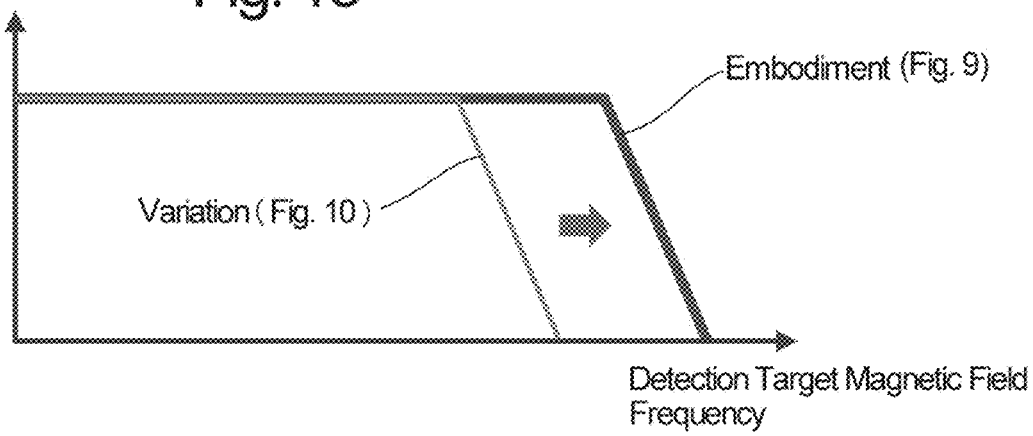
FIG. 13 is a simplified graph showing the comparison of frequency characteristics between the output voltage Vout in FIG. 9 and the output voltage Vout in FIG. 10.

FIG. 13 is a simplified graph showing the comparison of frequency characteristics between the output voltage Vout in FIG. 9 and the output voltage Vout in FIG. 10. This graph shows the magnitude of each output voltage Vout when the magnitude of the detection target magnetic field is made constant and the frequency is changed. Since a current-voltage convertor circuit which converts a negative feedback current into voltage includes the second operational amplifier 60 in addition to the first detection resistor Rs1 in the circuit shown in FIG. 9, a magnetic field having higher frequency can be detected as shown in FIG. 13 as compared with the constitution of FIG. 10 that current-voltage conversion is carried out only by the first detection resistor Rs1. This is because a burden on the first operational amplifier 50 is reduced in the circuit shown in FIG. 9 in which a negative feedback current is supplied by the first operational amplifier 50 and the second operational amplifier 60 as compared with the circuit shown in FIG. 10 in which a negative feedback current is supplied only by the first operational amplifier 50.

Figure 14:
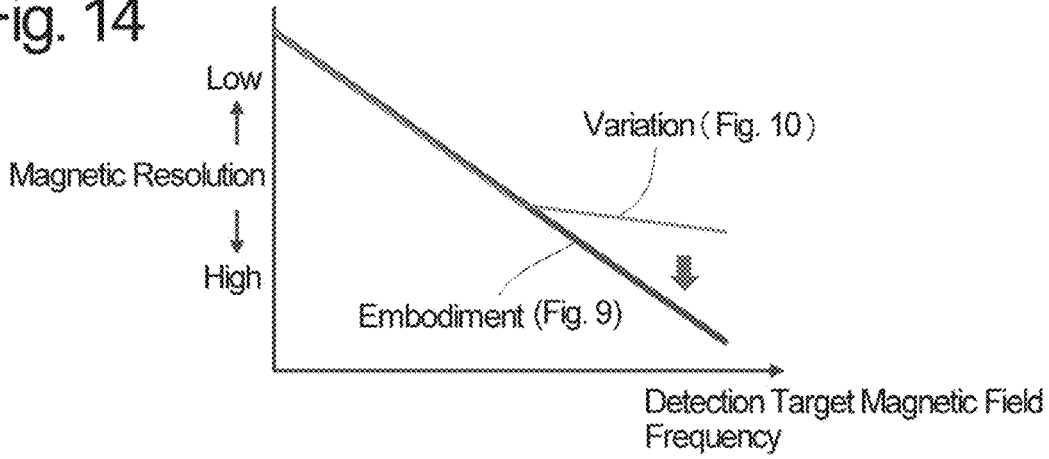
FIG. 14 is a simplified graph showing the comparison of frequency characteristics of magnetic resolution between the sensors of FIG. 9 and FIG. 10.

FIG. 14 is a simplified graph showing the comparison of frequency characteristics of magnetic resolution between the sensors shown in FIG. 9 and FIG. 10. In general, the resolution of a magneto-resistive element becomes higher as the frequency of a detection target magnetic field becomes higher due to the existence of noise called "1/f noise" whose energy is in inverse proportion to frequency. However, as shown in FIG. 14, in the constitution of the variation of FIG. 10, the improvement of resolution when the frequency becomes higher slows down when the frequency is higher than a certain value because the frequency characteristics of the first operational amplifier 50 become obstruction. As compared with this, in the circuit shown in FIG. 9, by providing the second operational amplifier 60, the obstruction by the frequency characteristics of the first operational amplifier 50 is reduced when the frequency becomes high even at a high-frequency range. Therefore, higher resolution is obtained at a high-frequency range so that a magnetic field having a higher frequency can be detected.

It is considered from FIG. 13 and FIG. 14 that when the frequency of a detection target magnetic field is, for example, 100 KHz or higher, the magnetic field at a high-frequency range can be detected by adopting the circuit constitution shown in FIG. 9. Meanwhile, when the frequency of a detection target magnetic field is low, an increase in the number of parts can be suppressed by adopting the circuit constitution shown in FIG. 10.

The following effects can be obtained according to this embodiment.

(1) In an environment where there exists a bias magnetic field not to be detected such as a disturbance magnetic field, the bias magnetic field detecting means detects a bias magnetic field applied to the first to fourth magneto-resistive elements (10, 20, 30, 40). A correcting magnetic field corresponding to the bias magnetic field is applied to the first to fourth magneto-resistive elements (10, 20, 30, 40). Then the operating points of the first to fourth magneto-resistive elements (10, 20, 30, 40) are stabilized at the same operating points as those where there is no bias magnetic field. Therefore, even in an environment where there exists a bias magnetic field, the sensitivity of the magnetic sensor is high. And, as compared with a case where there is no bias magnetic field detecting means as in the comparative example shown in FIG. 11, high output voltage Vout can be obtained when the magnitude of the detection target magnetic field is the same. Since the operating points of the first to fourth magneto-resistive elements (10, 20, 30, 40) become stable even in an environment where there exists a bias magnetic field, an error of the actual sensitivity from the assumed sensitivity can be reduced, thereby enhancing the measurement accuracy of the magnetic sensor.

(2) Since the first to fourth magneto-resistive elements (10, 20, 30, 40) which are bridge connected are used as the magnetic detecting unit, the resolution of magnetic field detection can be enhanced.

(3) Since magnetic balance in the magnetic detecting unit is retained, a change in the resistance change rate caused by environmental temperature in the first to fourth magneto-resistive elements (10, 20, 30, 40) is suppressed, thereby making it possible to maintain detection accuracy.

(4) Since the first magnetic field generating conductor 70 and the second magnetic field generating conductor 75 are formed in the same laminate 5 as the first to fourth magneto-resistive elements (10, 20, 30, 40), it is more advantageous in the size reduction of a product than when a separate solenoid coil is used and variation in positional accuracy at the time of production can be suppressed.

To take the maximum linear change in resistance value in this embodiment, the operating points of the first to fourth magneto-resistive elements (10, 20, 30, 40) are set to operating points where the bias magnetic field is zero. In other words, the operating points are set so that the total of the X direction component of the bias magnetic field and the X direction component of the correcting magnetic field at the position of each magneto-resistive element becomes substantially zero. However, the operating points of the first to fourth magneto-resistive elements (10, 20, 30, 40) may be set to operating points other than the operating points where the bias magnetic field is zero. In other words, the operating points may be set so that the total of the X direction component of the bias magnetic field and the X direction component of the correcting magnetic field at the position of each magneto-resistive element becomes a value except zero. Since the operating points of the first to fourth magneto-resistive elements (10, 20, 30, 40) depend on the intensity of the correcting magnetic field, that is, the magnitude of a current flowing through the second magnetic field generating conductor 75, the operating points can be adjusted regardless of the intensity of the bias magnetic field by setting the voltage value of the reference voltage source 78. When the operating points of the first to fourth magneto-resistive elements (10, 20, 30, 40) are set to operating points other than the operating points where the bias magnetic field is zero, if the bias magnetic field is weak, the X direction component of the correcting magnetic field and the X direction component of the bias magnetic field may intensify each other at the position of each magneto-resistive element. Even in this case, variation in the operating point of each magneto-resistive element caused by the bias magnetic field with variation that cannot be predicted can be suppressed. In other words, the total of the X direction component of the bias magnetic field and the X direction component of the correcting magnetic field can be made constant. And the above operating point can be stabilized.

Second Embodiment

Figure 15:
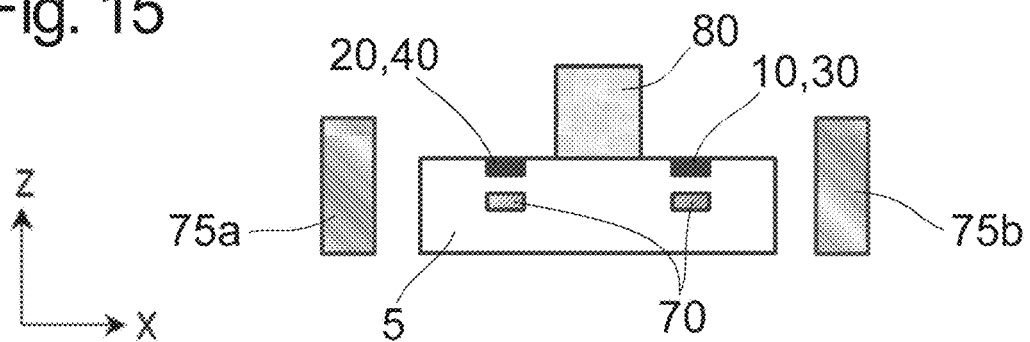
FIG. 15 is a schematic sectional view of a magnetic detecting unit and therearound in a magnetic sensor according to a second embodiment of the present invention.

FIG. 15 is a schematic sectional view of a magnetic detecting unit and therearound in a magnetic sensor according to a second embodiment of the present invention. The magnetic sensor of this embodiment is the same as the magnetic sensor of the first embodiment except that the second magnetic field generating conductor 75 formed in the laminate 5 in the first embodiment is replaced by second magnetic field generating conductors 75a and 75b which are formed external to the laminate 5. The second magnetic field generating conductors 75a and 75b are coils (solenoid coils etc.) whose winding axis direction is parallel to the X direction and provided on both sides of the laminate 5 in the X direction. The second magnetic field generating conductors 75a and 75b preferably be able to apply a uniform magnetic field parallel to the X direction to the first to fourth magneto-resistive elements (10, 20, 30, 40). According to this embodiment, the same effects as those of the first embodiment can be obtained except for size reduction and the positional accuracies of the second magnetic field generating conductors 75a and 75b.

Third and Fourth Embodiments

Figure 16:
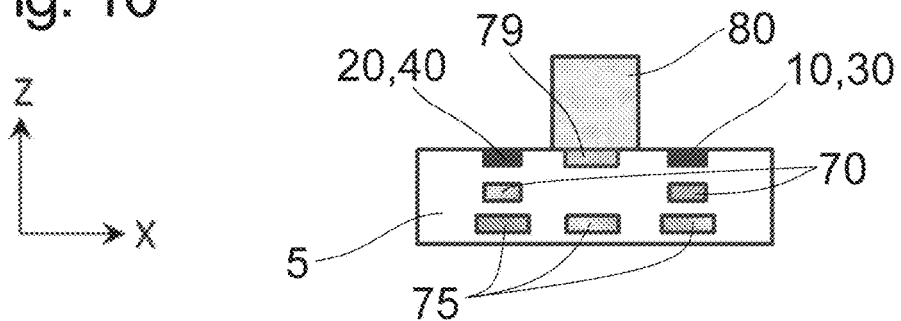
FIG. 16 is a schematic sectional view of a magnetic detecting unit and therearound in a magnetic sensor according to a third embodiment of the present invention.
Figure 17:
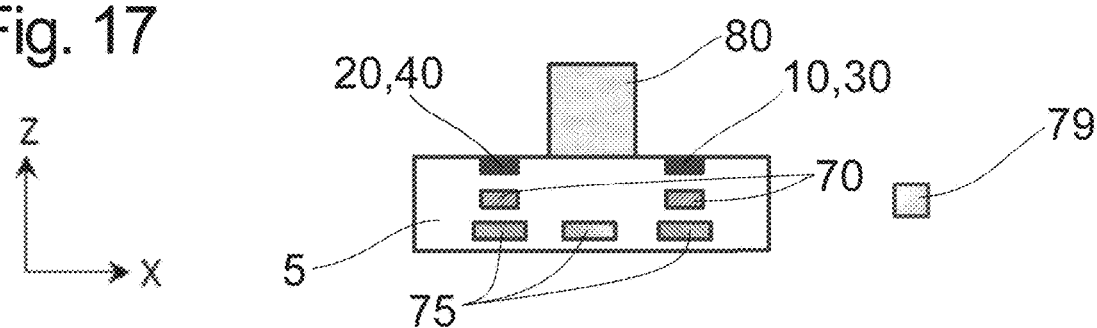
FIG. 17 is a schematic sectional view of a magnetic detecting unit and therearound in a magnetic sensor according to a fourth embodiment of the present invention.
Figure 18:
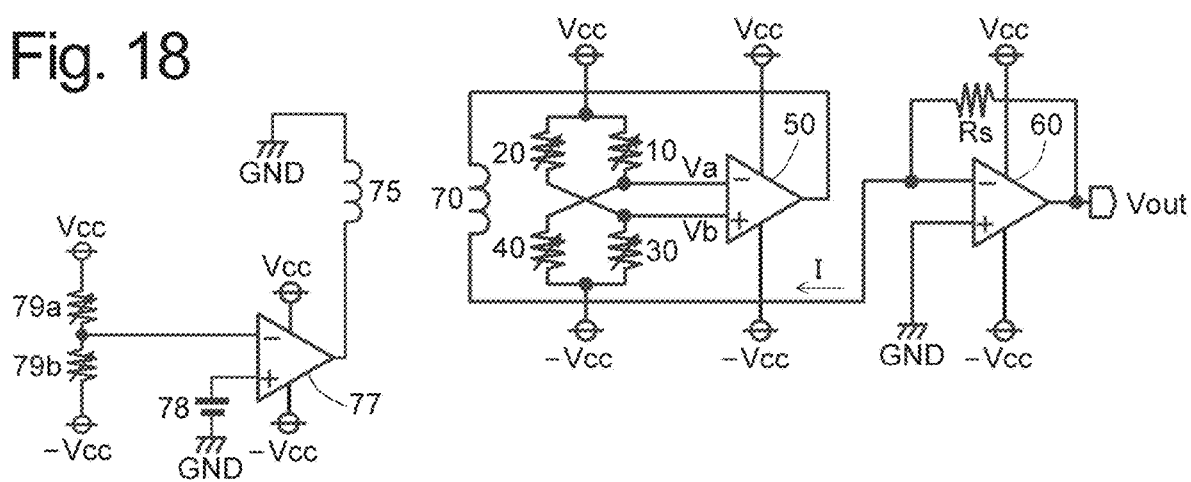
FIG. 18 is a schematic circuit diagram of the magnetic sensors of FIG. 16 and FIG. 17.

FIG. 16 is a schematic sectional view of a magnetic detecting unit and therearound in a magnetic sensor according to a third embodiment of the present invention. FIG. 17 is a schematic sectional view of a magnetic detecting unit and therearound in a magnetic sensor according to a fourth embodiment of the present invention. FIG. 18 is a schematic circuit diagram of the magnetic sensors shown in FIG. 16 and FIG. 17. In the first embodiment, the X direction component of the bias magnetic field is detected by a current flowing through the bridge circuit including the first to fourth magneto-resistive elements (10, 20, 30, 40). On the other hand, in the third and fourth embodiments, the X direction component of the bias magnetic field is detected by a magnetic detecting element 79 for detecting a bias magnetic field.

The magnetic detecting element 79 is arranged in the laminate 5 in the third embodiment shown in FIG. 16. The magnetic detecting element 79 is arranged external to the laminate 5 in the fourth embodiment shown in FIG. 17. In FIG. 18, two magneto-resistive elements 79a and 79b are used as the magnetic detecting element 79. Fixed layer magnetization directions of the magneto-resistive elements 79a and 79b are, for example, parallel to the X direction and opposite to each other in direction. The magneto-resistive elements 79a and 79b are connected in series between the first power line to which first power voltage Vcc is supplied and the second power line to which second power voltage −Vcc is supplied. An interconnection part between the magneto-resistive elements 79a and 79b is connected to the inverted input terminal of the fourth operational amplifier 77. The fourth operational amplifier 77 supplies a negative feedback current to the second magnetic field generating conductor 75 so that the difference between the voltage of the interconnection part between the magneto-resistive elements 79a and 79b (output voltage of the magnetic detecting element 79) and the output voltage of the reference voltage source 78 becomes substantially zero. When the operating points of the first to fourth magneto-resistive elements (10, 20, 30, 40) are set to operational points where the bias magnetic field is zero, the output voltage of the reference voltage source 78 is zero (the reference voltage source 78 is short-circuited). In this embodiment, the same effects as those of the first embodiment can be obtained.

While the invention has been described in its preferred embodiments, it is to be understood by a person having ordinary skill in the art that variations may be made on each constituent element and process of the embodiments without departing from the scope of the following claims. Variations of the invention will be described hereinafter.

While the correcting magnetic field is generated corresponding to the X direction component of the bias magnetic field in the above embodiments, the correcting magnetic field may be generated corresponding to the non-X direction component (for example, Y direction component) of the bias magnetic field in place of or in addition to the X direction component of the bias magnetic field.

While the magnetic detecting element is a magneto-resistive element in the above embodiments, the magnetic detecting element may be a Hall element or the like. Since the magneto-resistive elements detect a magnetic field in a direction parallel to the sensing plane, when the magneto-resistive elements are used as the magnetic detecting element, the sensing plane is arranged vertical to the Z direction. Meanwhile, as the Hall element detects a magnetic field in a direction vertical to the sensing plane, when the Hall element is used as the magnetic detecting element, the sensing plane is arranged vertical to the X direction. The number of magnetic detecting elements constituting a bridge circuit for detecting a detection target magnetic field is not limited to four as in the above embodiments and may be any number, for example, two or more. While the magnetic detecting unit has four magneto-resistive elements which are full-bridge connected in the above embodiments, the magnetic detecting unit may have two magneto-resistive elements which are half-bridge connected. The magnetic detecting element and the magnetic field generating conductors are not always formed in the same laminate and may be provided separately. Each element driven by dual power sources in the above embodiments may be driven by a single power source.

To further improve the detection accuracies of the first to fourth magneto-resistive elements (10, 20, 30, 40), a yoke may be formed between the magnetic body 80 and the first to fourth magneto-resistive elements (10, 20, 30, 40). Since more magnetic fields can be guided to the first to fourth magneto-resistive elements (10, 20, 30, 40) efficiently by forming the above yoke, a fine magnetic field can be detected accurately. When the above yoke is formed by a thin film forming process, the yoke can be arranged with accurate size and position. And the yoke can be formed in the same lamination step, resulting in a lower cost than a part attached externally, thereby making it possible to reduce the size of a product and cut the production cost.

Explanations of Letters of Numerals 5 laminate, 10 first magneto-resistive element, 30 third magneto-resistive element, 20 second magneto-resistive element, 40 fourth magneto-resistive element, 50 first operational amplifier (first differential amplifier), 60 second operational amplifier, 70 first magnetic field generating conductor, 75 second magnetic field generating conductor, 76 third operational amplifier, 77 fourth operational amplifier (second differential amplifier), 78 reference voltage source, 79 magnetic detecting element, 80 magnetic body.

The invention claimed is:
1. A magnetic sensor comprising:
a magnetic detecting unit including first and second magnetic detecting elements to which a first magnetic field to be detected is applied;
a first differential amplifier into which an output voltage of the magnetic detecting unit is input and which outputs a first negative feedback current;
a first magnetic field generating conductor which, in response to the first negative feedback current output by the first differential amplifier, applies a second magnetic field to the first and second magnetic detecting elements to cancel the first magnetic field detected by the first and second magnetic detecting elements;
bias magnetic field detecting means which detects a predetermined directional component of a bias magnetic field applied to the first and second magnetic detecting elements and outputs a second negative feedback current corresponding to magnitude of the predetermined directional component, regardless of the output voltage of the magnetic detection unit, the bias magnetic field detecting means detecting the predetermined directional component of the bias magnetic field; and a second magnetic field generating conductor which, in response to the second negative feedback current, applies a correcting magnetic field to the first and second magnetic detecting elements, wherein a total of the predetermined directional component of the bias magnetic field and a predetermined directional component of the correcting magnetic field at positions of the first and second magnetic detecting elements is substantially constant.

2. The magnetic sensor according to claim 1, wherein the total of the predetermined directional component of the bias magnetic field and the predetermined directional component of the correcting magnetic field at the positions of the first and second magnetic detecting elements is substantially zero.

3. The magnetic sensor according to claim 1, wherein the bias magnetic field detecting means has another magnetic detecting element to which the bias magnetic field is applied and a second differential amplifier which outputs the second negative feedback current by inputting the output voltage of the another magnetic detecting element.

4. The magnetic sensor according to claim 1, comprising a magnetic body which changes direction of the first magnetic field to be detected so that the first magnetic field has magnetic field components opposite to each other at the positions of the first and second magnetic detecting elements.

5. The magnetic sensor according to claim 4, wherein
the first and second magnetic detecting elements are magneto-resistive elements, and
the bias magnetic field detecting means detects the bias magnetic field by a current flowing through the first and second magnetic detecting elements.

6. The magnetic sensor according to claim 5, wherein the first and second magnetic detecting elements have identical fixed layer magnetization directions.

7. The magnetic sensor according to claim 5, wherein the bias magnetic field detecting means outputs the second negative feedback current so that a current flowing through the first and second magnetic detecting elements becomes a reference value.

8. A magnetic sensor comprising:
a magnetic detecting unit including first and second magnetic detecting elements to which a first magnetic field to be detected is applied;
a first differential amplifier into which an output voltage of the magnetic detecting unit is input and which outputs a first negative feedback current;

a first magnetic field generating conductor which, in response to the first negative feedback current output by the first differential amplifier, applies to the first and second magnetic detecting elements a second magnetic field to cancel the first magnetic field detected by the first and second magnetic detecting elements;

bias magnetic field detecting means which detects a predetermined directional component of a bias magnetic field applied to the first and second magnetic detecting elements and outputs a second negative feedback current corresponding to magnitude of the predetermined directional component, regardless of the output voltage of the magnetic detection unit, the bias magnetic field detecting means detecting the predetermined directional component of the bias magnetic field; and a second magnetic field generating conductor which, in response to the second negative feedback current, applies a correcting magnetic field to the first and second magnetic detecting elements to cancel the bias magnetic field at the positions of the first and second magnetic detecting elements.

9. The magnetic sensor according to claim 8, comprising a magnetic body which changes direction of the first magnetic field to be detected so that the first magnetic field has magnetic field components opposite to each other at the positions of the first and second magnetic detecting elements.

10. The magnetic sensor according to claim 9, wherein
the first and second magnetic detecting elements are magneto-resistive elements, and
the bias magnetic field detecting means detects the bias magnetic field by a current flowing through the first and second magnetic detecting elements.

11. The magnetic sensor according to claim 10, wherein the first and second magnetic detecting elements have identical fixed layer magnetization directions.

12. The magnetic sensor according to claim 10, wherein the bias magnetic field detecting means outputs the second negative feedback current so that a current flowing through the first and second magnetic detecting elements becomes a reference value.

13. The magnetic sensor according to claim 8, wherein the bias magnetic field detecting means has another magnetic detecting element to which the bias magnetic field is applied and a second differential amplifier which outputs the second negative feedback current by inputting the output voltage of the another magnetic detecting element.

* * * * *